United States Patent
Suzuki (10) Patent No.: US 8,170,151 B2
(45) Date of Patent: May 1, 2012

(54) FSK RECEIVER

(75) Inventor: Shigeya Suzuki, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 605 days.

(21) Appl. No.: 12/388,015

(22) Filed: Feb. 18, 2009

(65) Prior Publication Data

US 2009/0225905 A1    Sep. 10, 2009

(30) Foreign Application Priority Data

Mar. 5, 2008   (JP) .................. 2008-054655

(51) Int. Cl.
*H03D 3/00* (2006.01)

(52) U.S. Cl. ........ 375/334; 375/316; 375/346; 329/315; 329/318; 329/319; 329/300; 329/320; 329/323; 329/324; 329/325; 455/205; 455/214; 455/230; 455/339; 455/340

(58) Field of Classification Search .......... 375/334, 375/316, 346; 329/315, 318, 319, 300, 320, 329/323, 324, 325; 455/205, 214, 230, 339, 455/340

See application file for complete search history.

(56) References Cited

U.S. PATENT DOCUMENTS

| 3,899,741 A * | 8/1975 | Brandt et al. ............... 329/301 |
| 4,488,120 A * | 12/1984 | Carsten ................... 329/302 |
| 6,335,953 B1 * | 1/2002 | Sanderford et al. ......... 375/344 |
| 2002/0135418 A1 * | 9/2002 | Amano ................... 329/315 |
| 2006/0226897 A1 * | 10/2006 | De Ruijter .............. 329/315 |

FOREIGN PATENT DOCUMENTS

| JP | 2137552 A | 5/1990 |
| JP | 5191461 A | 7/1993 |
| JP | 07-058654 A | 3/1995 |
| JP | 9064772 A | 3/1997 |
| JP | 2001268472 A | 9/2001 |
| JP | 2006229427 A | 8/2006 |
| JP | 2007-158780 A | 6/2007 |

OTHER PUBLICATIONS

Notice of Reasons for Rejection issued Nov. 15, 2011 by the Japanese Patent Office in counterpart Japanese Patent Application No. 2008-054655.

* cited by examiner

*Primary Examiner* — Siu Lee (74) *Attorney, Agent, or Firm* — Sughrue Mion, PLLC (57) ABSTRACT

A receiver includes a band-pass filter that limits a passband of an IF (Intermediate Frequency) signal, an FSK detector that detects the IF signal passing through the band-pass filter to generate a detection signal, and a control block that controls a modulation sensitivity of the FSK detector and a pass bandwidth of the band-pass filter, in which the control block controls the modulation sensitivity of the FSK detector according to the pass bandwidth of the band-pass filter.

10 Claims, 8 Drawing Sheets

FSK RECEIVER

BACKGROUND

1. Field of the Invention

The present invention relates to a receiver having an intermediate frequency such as a single conversion system and a Low-IF (low-IF) system, and more specifically, to a receiver using an IF band-pass filter and an FSK detector.

2. Description of Related Art

In recent years, size and power consumption have been required to be decreased in communication devices such as an ISM (Industry-Science-Medical) band or a specified low power radio, and many functions have been IC-processed. Similarly, receivers used with them also have function circuits such as an LNA, a mixer, an IF filter, an oscillator, a PLL (Phase Locked Loop) frequency synthesizer, a demodulator or the like that are made into IC. Further, in the receiver mainly used in a remote keyless entry (RKE)/tire pressure sensor (TPMS: tire pressure monitoring system), many IF filters have been incorporated. In accordance with this, the IF frequency has been made lower from conventional 10.7 MHz with an external ceramic filter, to several hundreds of kHz.

Figure 5:
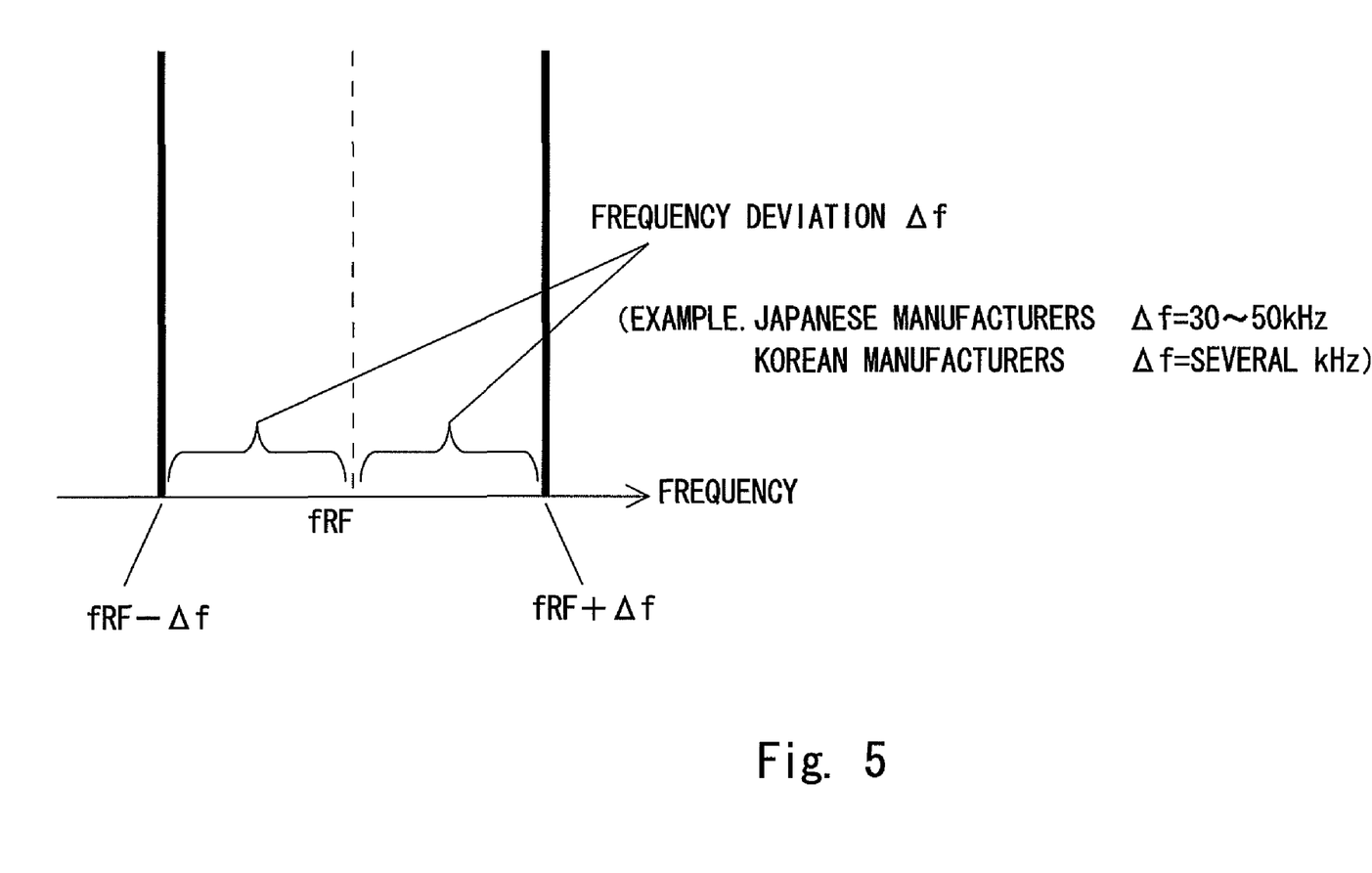
FIG. 5 shows the frequency deviation.

On the other hand, the reception sensitivity has become higher at high speed. Along with this, the optimization of the IF filter bandwidth and the high sensitivity of the detector are one of the most important tasks in forming a receiver. Especially in a case of the FSK receiver, as shown in FIG. 5, frequency deviation is different among customers, systems, or destination countries. As shown in FIG. 5, a deviation ($\Delta f$) of the frequency from a reference value (f) due to the variation of the operation condition is 30 to 50 kHz in Japanese manufacturers; on the other hand, it is only several kHz in Korean manufacturers, for example, which is widely different between countries.

Figure 6:
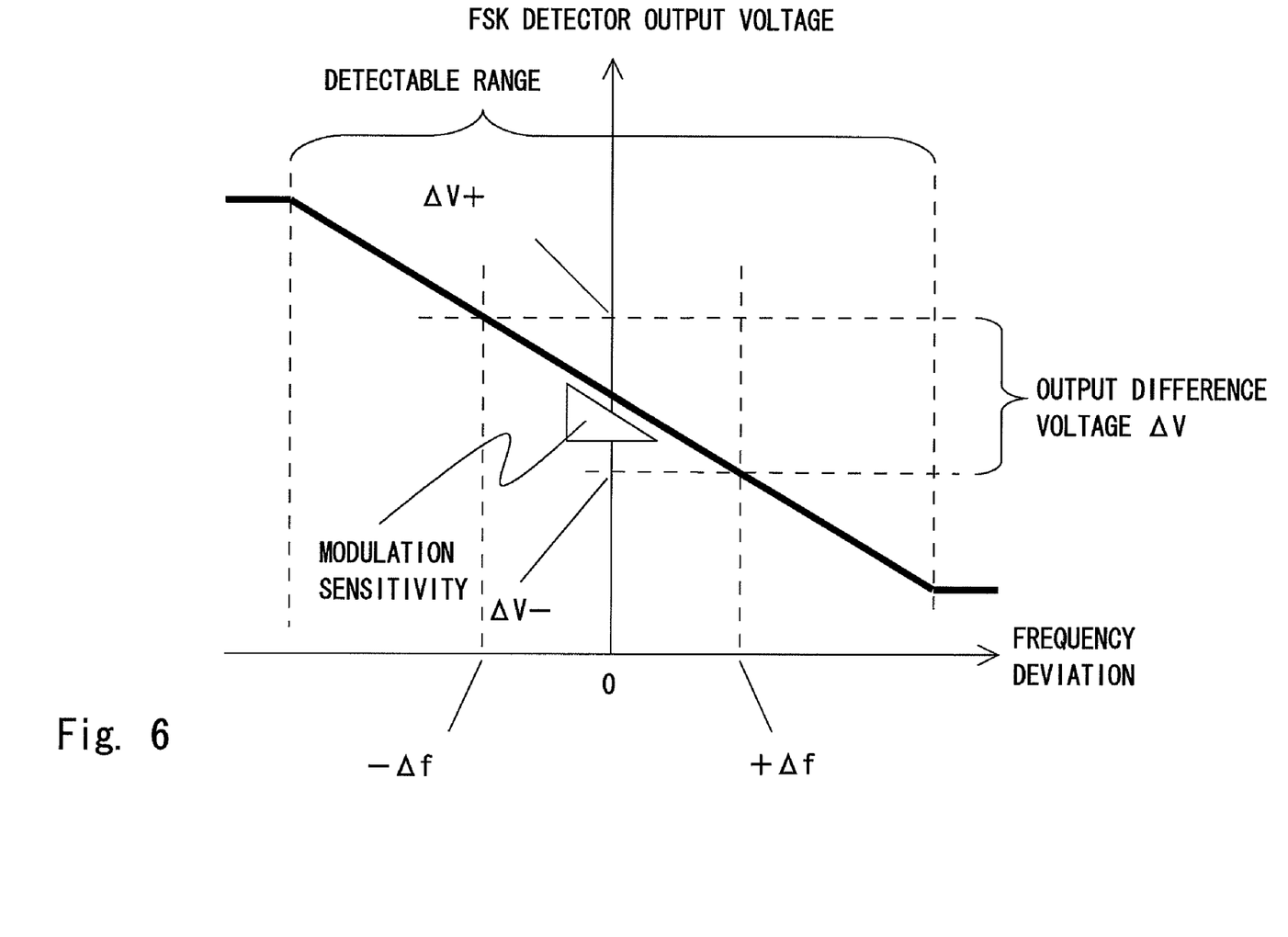
FIG. 6 is a diagram describing modulation sensitivity.

Further, there are configurations in which a transmitter includes a SAW (surface acoustical wave) resonator having low frequency stability (±several hundreds of ppm) which requires low cost and a crystal resonator having high frequency stability (±several tens of ppm) which requires high cost. With these various specifications and configurations, a bandwidth optimization method of the IF filter and an optimization method of the modulation sensitivity of the FSK detector have become more and more important in order to realize high reception sensitivity in one FSK receiver. FIG. 6 is a graph for describing the modulation sensitivity of the FSK detector. The horizontal axis indicates a frequency deviation, and the longitudinal axis indicates an output voltage difference of the FSK detector. In this case, the inclination indicates a modulation sensitivity. When the modulation sensitivity is low, the output voltage difference $\Delta V$ is made small, which results in difficult detection. However, when the modulation sensitivity is too high, the detectable range becomes smaller.

Figure 7:
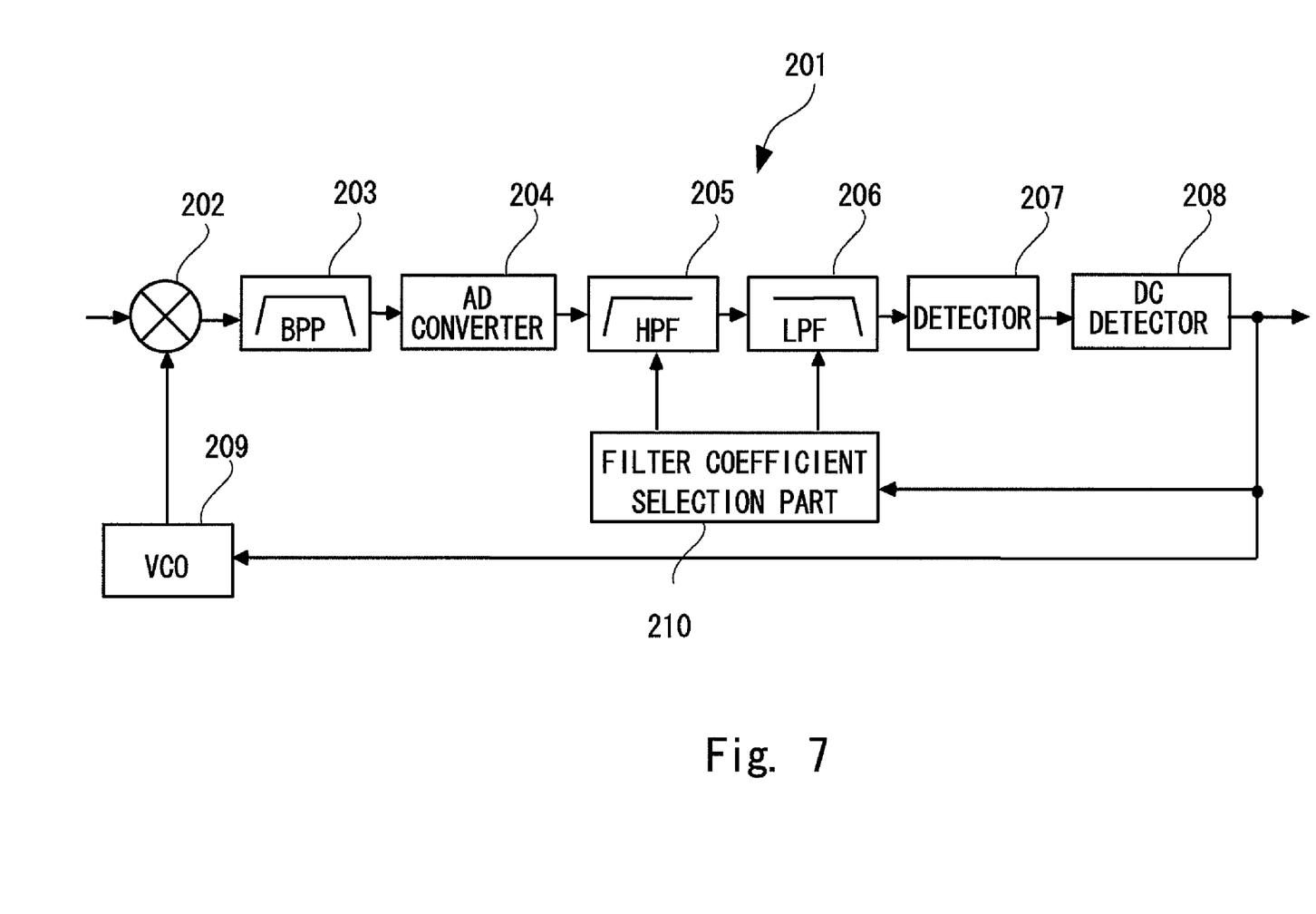
FIG. 7 shows a passband control device disclosed in Japanese Unexamined Patent Application Publication No. 2007-158780.

FIG. 7 shows a passband control device disclosed in Japanese Unexamined Patent Application Publication No. 2007-158780. An FSK receiver 201 includes a mixer 202, a BPF 203, an A/D converter 204, a HPF 205, a LPF 206, a detector 207, a DC detector 208, a VCO (voltage controlled oscillator) 209, and a filter coefficient selection part 210. First, the FSK receiver 201 mixes an RF signal input from outside through an antenna with a local oscillation signal from the VCO 209 by the mixer 202 to generate an IF signal. After cutting off undesired frequency bandwidth by the BPF 203, this IF signal is subjected to digital conversion by the A/D converter 204. Then, the FSK receiver 201 cuts off the low-frequency component of the IF signal by the HPF 205 and cuts off the high-frequency component by the LPF 206.

Figure 8A:
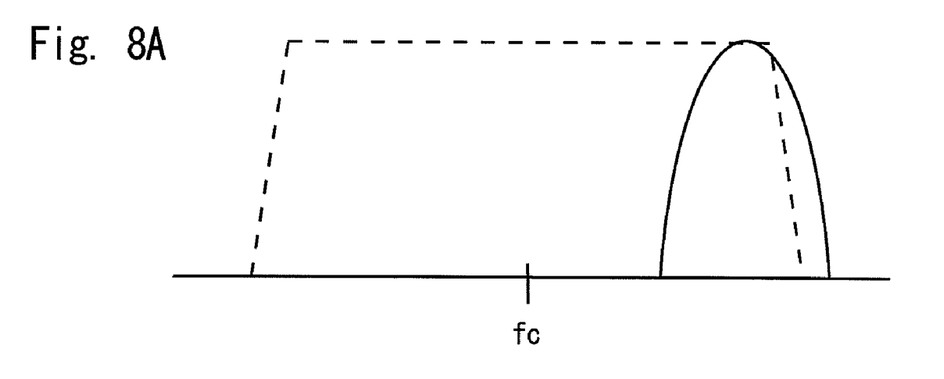
FIGS. 8A to 8C show a detection signal.
Figure 8B:
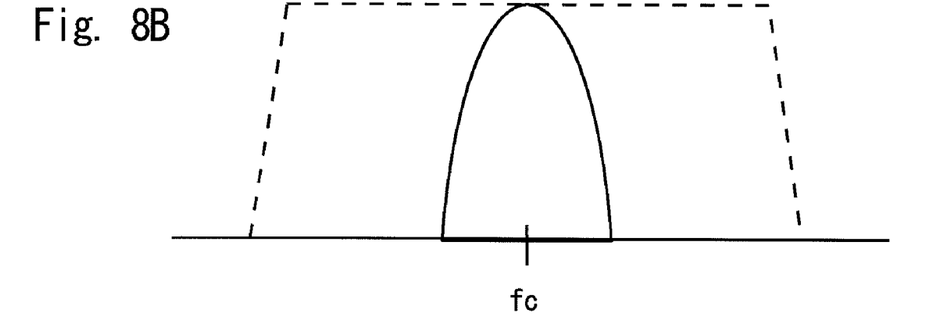
Figure 8C:
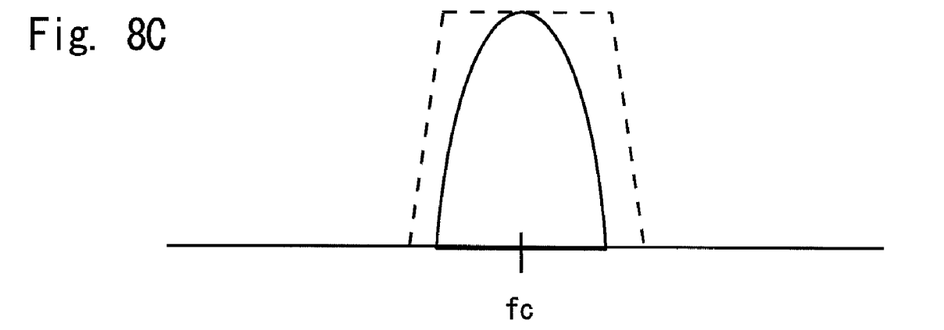

Subsequently, the FSK receiver 201 detects the IF signal in the detector 207 to obtain a detection signal (FIG. 8(A)). Then, an automatic frequency control (AFC) operation is performed on the DC component of the detection signal detected by the DC detector 208 so as to make the center frequency of the IF signal match the center frequency fc of the HPF 205 and the LPF 206, as shown in FIG. 8(B). Then, the FSK receiver 201 changes the filter coefficient of the HPF 205 and the LPF 206, and sets an ideal bandwidth that substantially matches the spectrum of the IF signal, as shown in FIG. 8(C).

Further, Japanese Unexamined Patent Application Publication No. 7-58654 discloses a receiver that automatically controls additional circuit means of a receiver in an optimum setting state by discriminating a reception mode from reception signals. According to this related receiver, the reception signal is converted to a first intermediate frequency signal and bisected, one of them is converted to a first demodulation signal through a wide-band-pass filter and a variable band width filter. An AGC means is provided in the reception system, and the first demodulation signal is output as a low frequency through a tone adjustment means. Also, the other one is converted to a second demodulation signal through a narrow-band-pass filter. An interference condition is discriminated in an interference discrimination means from the levels of the first and second modulation signals. The signals passing through the wide-band-pass and narrow-band-pass filters are subjected to fast Fourier transform in first and second Fourier transformation means. A central arithmetic means discriminates the reception mode from the pattern of the Fourier-transformed signal in the condition without interference and controls the variable band width filter, the AGC means, and the tone adjustment means corresponding to it.

SUMMARY

However, in the technique disclosed in Japanese Unexamined Patent Application Publication No. 2007-158780, only the passbands of the HPF 205 and the LPF 206 forming the IF filter can be controlled, and the modulation sensitivity of the detector 207 is fixed. Thus, when the frequency deviation of the input FSK modulation signal is larger than the expected value, normal detection and reception may not become possible as the frequency deviation is out of the detectable range of the FSK detector due to some influences (element variation, temperature variation, or power supply voltage variation). On the other hand, when the frequency deviation is smaller than the expected value, the difference voltage $\Delta V$ of the DC component output from the detector with respect to the frequency deviation $\pm\Delta f$ becomes smaller than a case of the expected frequency deviation. Thus, the S/N in the comparator input part and the reception sensitivity are degraded.

Further, in the technique disclosed in Japanese Unexamined Patent Application Publication No. 7-58654, the reception mode of the reception signal is discriminated, and the variable band width filter and the AGC means that are additional circuit means are automatically adjusted to the optimum setting state with respect to the reception mode which is discriminated. Accordingly, the optimization of the demodulation circuit for each reception mode is not performed. If the optimization of the demodulation circuit is not performed, in case of the FM modulation signal, for example, there is caused a problem as follows. That is, when there are specifications of different frequency deviations $\Delta f1$ and $\Delta f2$ ($\Delta f1 > \Delta f2$), the reception sensitivity is degraded with the specification of $\Delta f2$ in which the deviation is smaller.

Further, as the reception mode (CW, RTTY, SSB, AM, FM or the like) is discriminated after receiving the signal, the rising time is slow with the system performing the intermittent operation such as RKE, for example, which means that there is a need to keep the state in which the operation of the receiver is in ON state for a long time, and this may cause increase of the power consumption of the system. Further, the configuration is complicated while it is possible to accord with various reception modes. This causes increase of the chip area, which leads to higher cost, so that this configuration is not suitable for the system in which the modulation system is fixed.

A first exemplary aspect of an embodiment of the present invention is a receiver, including a passband limiter that limits a passband of an IF (Intermediate Frequency) signal, a detector that detects the IF signal passing through the passband limiter to generate a detection signal, and a controller that controls a modulation sensitivity of the detector and a pass bandwidth of the passband limiter, in which the controller controls the modulation sensitivity according to the pass bandwidth.

A second exemplary aspect of an embodiment of the present invention is a receiving method, including limiting a passband of an IF (Intermediate Frequency) signal by a passband limiter, and detecting the IF signal passing through the passband limiter by a detector having a modulation sensitivity according to a pass bandwidth of the passband limiter to generate a detection signal.

According to the present invention, it is possible to determine the pass bandwidth of the passband limiter according to the frequency deviation, for example. At this time, the modulation sensitivity is determined according to the pass bandwidth. Thus, it is possible to control the modulation sensitivity so that it becomes higher when the pass bandwidth is made narrower, and the modulation sensitivity becomes lower when the pass bandwidth is made wider.

According to the present invention, it is possible to provide a receiver realizing the high-sensitive receiving in accordance with various specifications of frequency deviations and a frequency stability of a transmitter.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The specific exemplary embodiment to which the present invention is applied will be described in detail with reference to the drawings. This exemplary embodiment is the one in which the present invention is applied to an FSK (frequency modulation: Frequency Shift Keying) receiver.

Figure 1:
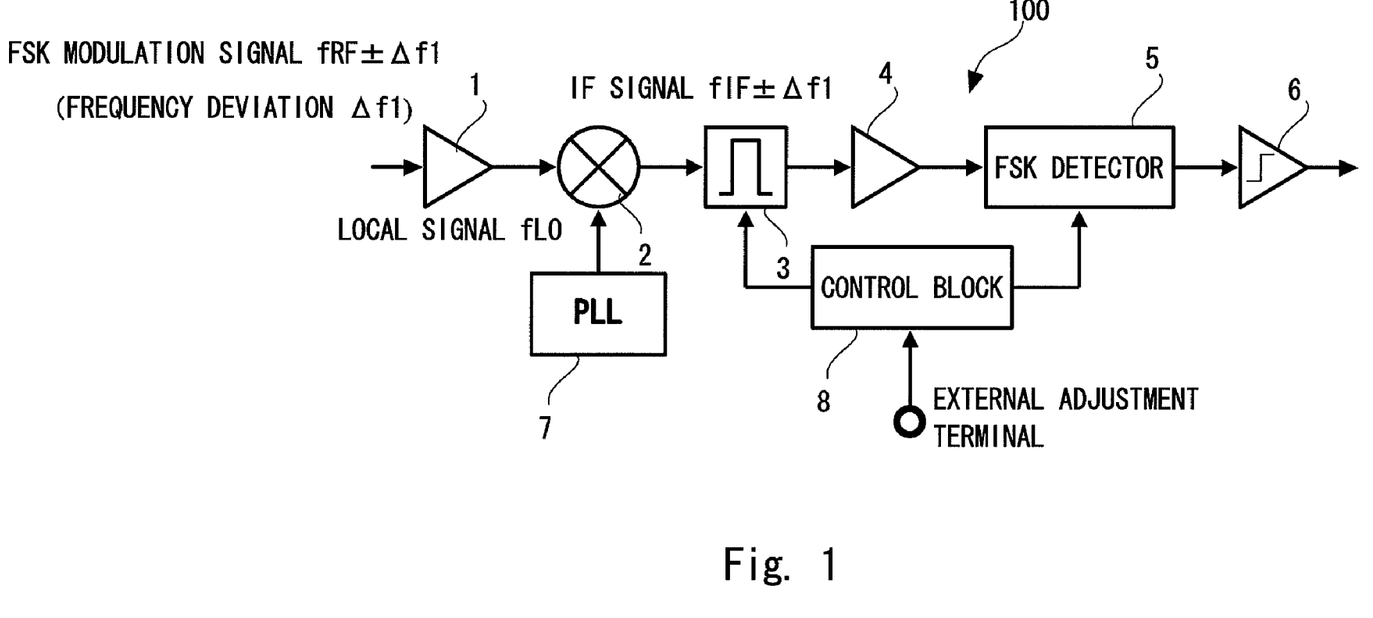
FIG. 1 is a block diagram showing a receiver according to an exemplary embodiment of the present invention.

FIG. 1 is a block diagram showing a receiver according to an exemplary embodiment of the present invention. An FSK receiver 100 includes a first-stage low-noise amplifier 1, a mixer 2, an IF (Intermediate Frequency) band-pass filter (BPF) 3 functioning as a passband limiter that limits a passband of an IF signal, an IF limiter amplifier 4, an FSK detector 5 detecting the IF signal passing through the IF BPF 3 to generate a detection signal, a comparator 6, a PLL 7 generating a local signal, and a control block 8 controlling the pass bandwidth of the IF BPF 3 and modulation sensitivity of the FSK detector 5. The control block 8 includes an external adjustment terminal controlling both of the pass bandwidth of the IF BPF 3 and the modulation sensitivity of the FSK detector 5 while being made correspondent to each other.

The first-stage low-noise amplifier 1 amplifies an FSK received high-frequency signal fRF±Δf having a frequency deviation Δf. The mixer 2 receives an output signal of the low-noise amplifier 1 and an output signal of the PLL to output the IF signal having a frequency of fIF±Δf. This IF signal is input to the IF band-pass filter 3. At this time, the IF band-pass filter 3 is controlled to have a minimum bandwidth with respect to the frequency deviation Δf by the control block 8 adjusted by the external adjustment terminal in accordance with the frequency stability of a transmitter and the frequency deviation Δf. The IF limiter amplifier 4 limits the amplitude of the output signal of the IF band-pass filter 3, and inputs the output signal to the FSK detector 5.

The FSK detector 5 is controlled to have a maximum modulation sensitivity with respect to the frequency deviation Δf by the control block 8 as in the same way as the bandwidth of the IF band-pass filter 3, and outputs a DC difference voltage ΔV corresponding to the frequency deviation ±Δf. This output difference voltage is input to the comparator 6, and the comparator 6 outputs the signal which is demodulated into a digital signal.

Figure 2:
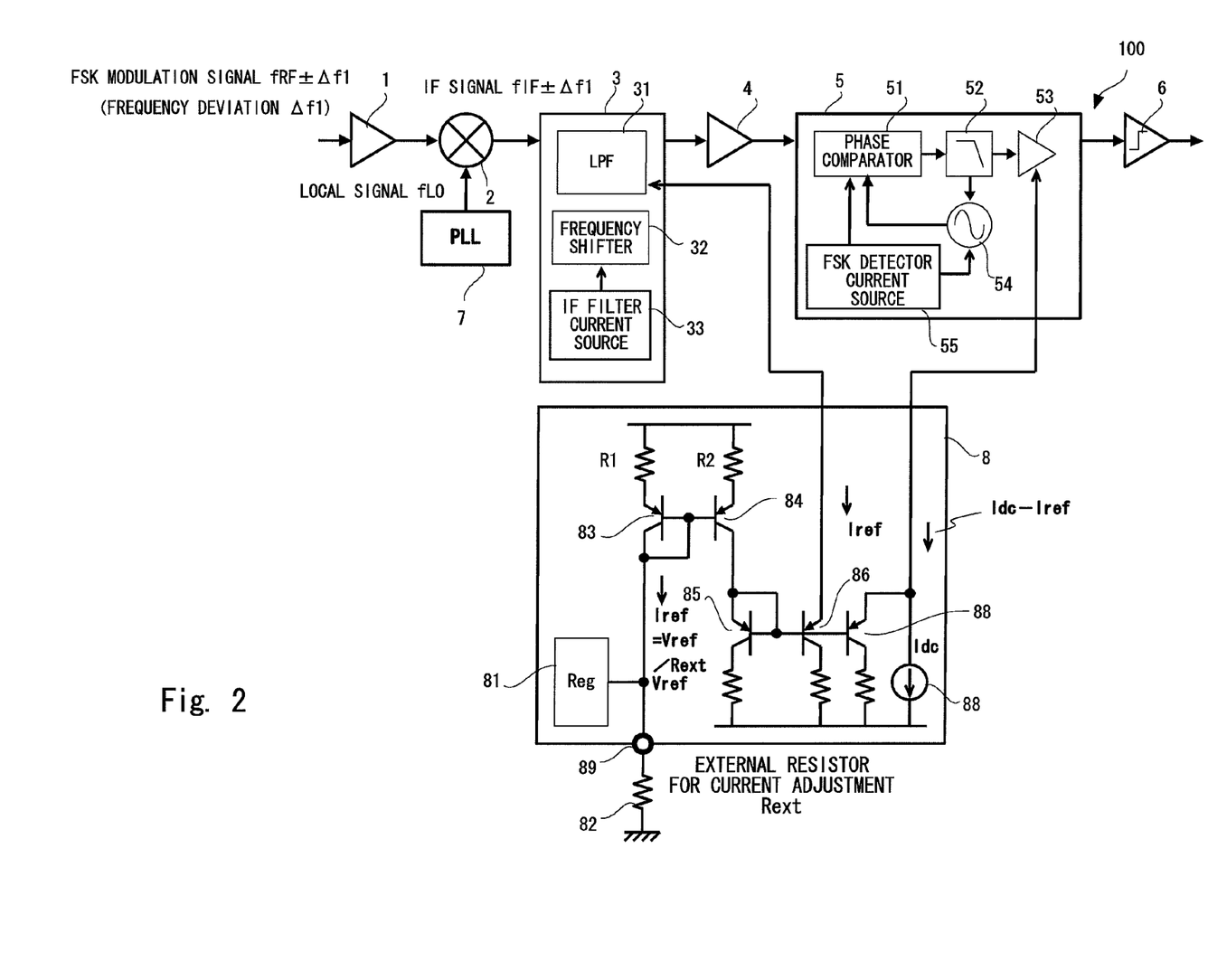
FIG. 2 shows a detail of an FSK receiver according to the exemplary embodiment shown in FIG. 1.

FIG. 2 shows a detail of the FSK receiver according to the exemplary embodiment shown in FIG. 1. In the exemplary embodiment, the IF band-pass filter 3 is a complex band-pass filter including a LPF 31, a frequency shifter 32, and an IF filter current source 33. In this complex band-pass filter 3, the IF filter current source 33 shifts the frequency of the frequency shifter 32. The frequency shifter 32 shifts the low frequency side of the LPF 31 to form the band-pass filter.

Further, the FSK detector 5 may be a PLL-type FSK detector including a phase comparator 51, a LPF 52, an amplifier 53, a CCO (Current Controlled Oscillator) 54, and an FSK detector current source 55. The amplitude of the output signal of the IF band-pass filter 3 is limited by the IF limiter amplifier, and the signal is input to the phase comparator 51. In the phase comparator 51, the phase of the signal from the CCO 54 is compared with the phase of the input signal. The output of the phase comparator 51 is input to the low-pass filter 52, and the high-frequency component is cut off. The output of the low-pass filter 52 is input to the amplifier 53. A gain of the amplifier 53 is controlled by a first current from a control block 8 which will be described below, and the signal corresponding to this gain is output.

The control block 8 includes a reference power supply 81, an external resistor 82, transistors 83 to 87, a constant current source 88, and an external adjustment terminal 89, and is able to control a cutoff frequency fc of the LPF 31 of the complex band-pass filter 3 by a current determined by a value Rext of the external resistor connected to the external adjustment terminal 89. Further, the gain of the amplifier 53 of the PLL-type FSK detector 5, which is the modulation sensitivity, can be adjusted by the external resistance value Rext and the current value of the constant current source 88.

The external resistor 82 is connected between the external adjustment terminal 89 and a ground. The transistor 83 and a resistor R1 are connected between the external adjustment terminal 89 and a power supply. The transistor 84 and the transistor 83 form a current mirror, and an emitter of the transistor 84 is connected to the power supply through a resistor R2. A collector of the transistor 84 is connected to an emitter of the transistor 85. A collector of the transistor 85 is connected to the ground through a resistor R3. The transistor 86 and the transistor 85 form a current mirror. An emitter of the transistor 86 is connected to the LPF 31 of the IF band-pass filter 3. A collector of the transistor 86 is connected to the ground through a resistor R4. A base of the transistor 87 is connected to a base of the transistor 86, and a collector of the transistor 87 is connected to the ground through a resistor R5. Further, the constant current source 88 is connected between an emitter of the transistor 87 and the ground. The emitter of the transistor 87 is connected to the amplifier 53.

Upon determination of the external resistance value Rext, current Iref as a second current flowing in the emitter of the transistor 86, and current Idc-Iref as a first current flowing in the emitter of the transistor 87 are determined. The cutoff frequency of the LPF 31 is controlled by the current Iref. The current Idc-Iref controls the gain of the amplifier 53, which is the modulation sensitivity of the FSK detector 5. The control block 8 determines the magnitude of the external resistance value Rext and the constant current source Idc so as to determine the current values of the current Iref and the current Idc-Iref, so that the gain of the amplifier 53 and the cutoff frequency of the LPF 31 are controlled. At this time, the control block 8 is formed so that the current Idc-Iref decreases and the gain of the amplifier 53 increases as the current Iref increases and the pass bandwidth of the IF band-pass filter 3 decreases. On the other hand, the control block 8 is formed so that the current Idc-Iref increases and the gain of the amplifier 53 decreases as the current Iref decreases and the pass bandwidth of the IF band-pass filter 3 increases.

In general, the reception sensitivity is estimated by the following expression.

[reception sensitivity]=[thermal noise]+[system noise characteristics]+[system bandwidth]+[comparable S/N of comparator] (1)

For example, the reception sensitivity with the system having the system noise characteristics of 5 dB, the bandwidth of the system (IF filter bandwidth) of 350 kHz, and the comparable S/N of the comparator of 6 dB is estimated as follows.

$10 \times \log(1.38e-23 \times 298 \times 1000)+5+10 \times \log(350e3)+6 = -107$ dBm (2)

As such, in order to increase the reception sensitivity, it may be possible to decrease the system noise characteristics determined by the noise characteristics of the first-stage low-noise amplifier 1 or to make the bandwidth of the IF band-pass filter 3 narrower. Further, as the S/N of the input part of the comparator 6 increases as the modulation sensitivity of the FSK detector 5 becomes higher, the reception sensitivity becomes higher as the modulation sensitivity becomes higher.

However, the FSK receiver generally needs to secure a detectable range of the FSK detector 5 and the bandwidth of the IF band-pass filter 3 that are about more than five times larger than the frequency deviation Δf in consideration of the temperature variation, the power supply voltage variation, and the element variation inside the IC. Further, when the frequency stability of the transmitter is low, the detectable range of the FSK detector and the bandwidth of the IF band-pass filter 3 need to be made wider in accordance with the low frequency stability.

In the configuration of the receiver according to the exemplary embodiment shown in FIG. 2, the following relation will be established.

[bandwidth of complex band-pass filter] ∝ [current value Iref of LPF] ∝ 1/Rext (3)

[modulation sensitivity of FSK detector] ∝ [gain of amplifier of FSK detector] ∝ [current value of amplifier of FSK detector (Idc-Iref)] ∝ Rext (4)

Accordingly, in the specification of the frequency deviation Δf1, the external resistance value Rext for current adjustment is adjusted, and the detectable range of the FSK detector and the bandwidth of the IF filter are controlled to be about five times larger than Δf1, which makes it possible to obtain higher reception sensitivity.

Figure 3:
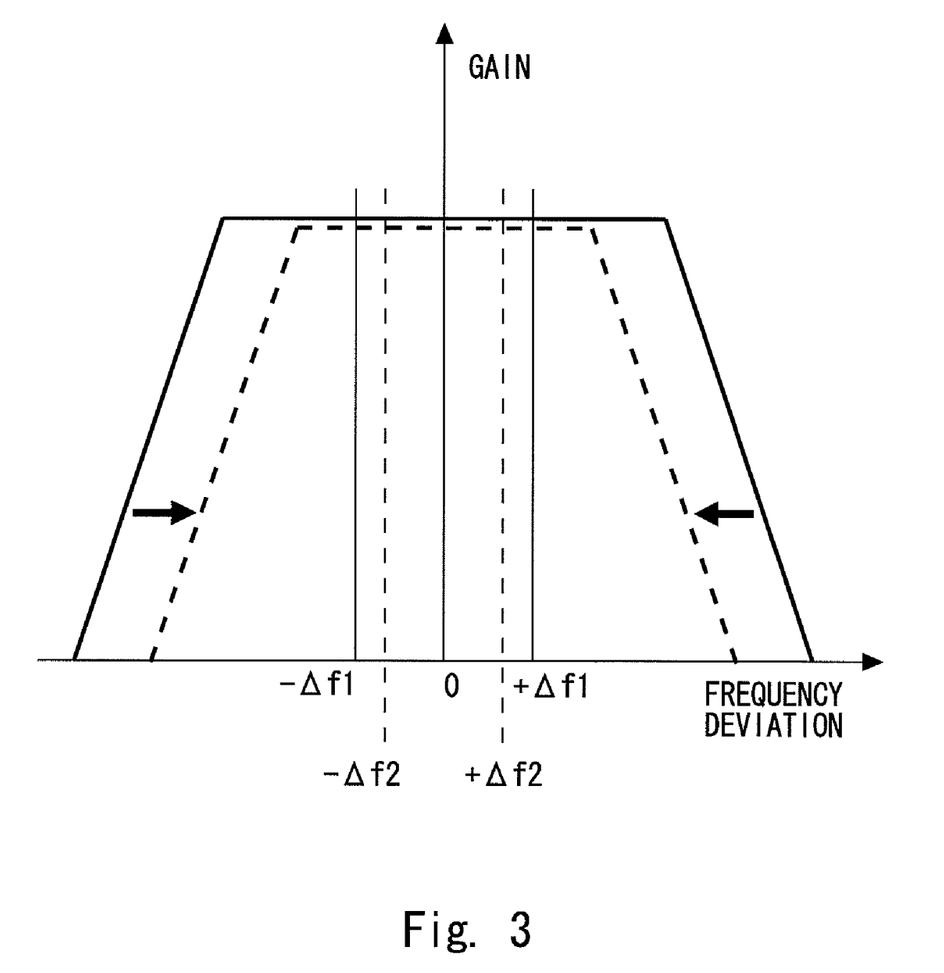
FIG. 3 shows IF filter characteristics, with a horizontal axis showing frequency deviation and a longitudinal axis showing gain.
Figure 4:
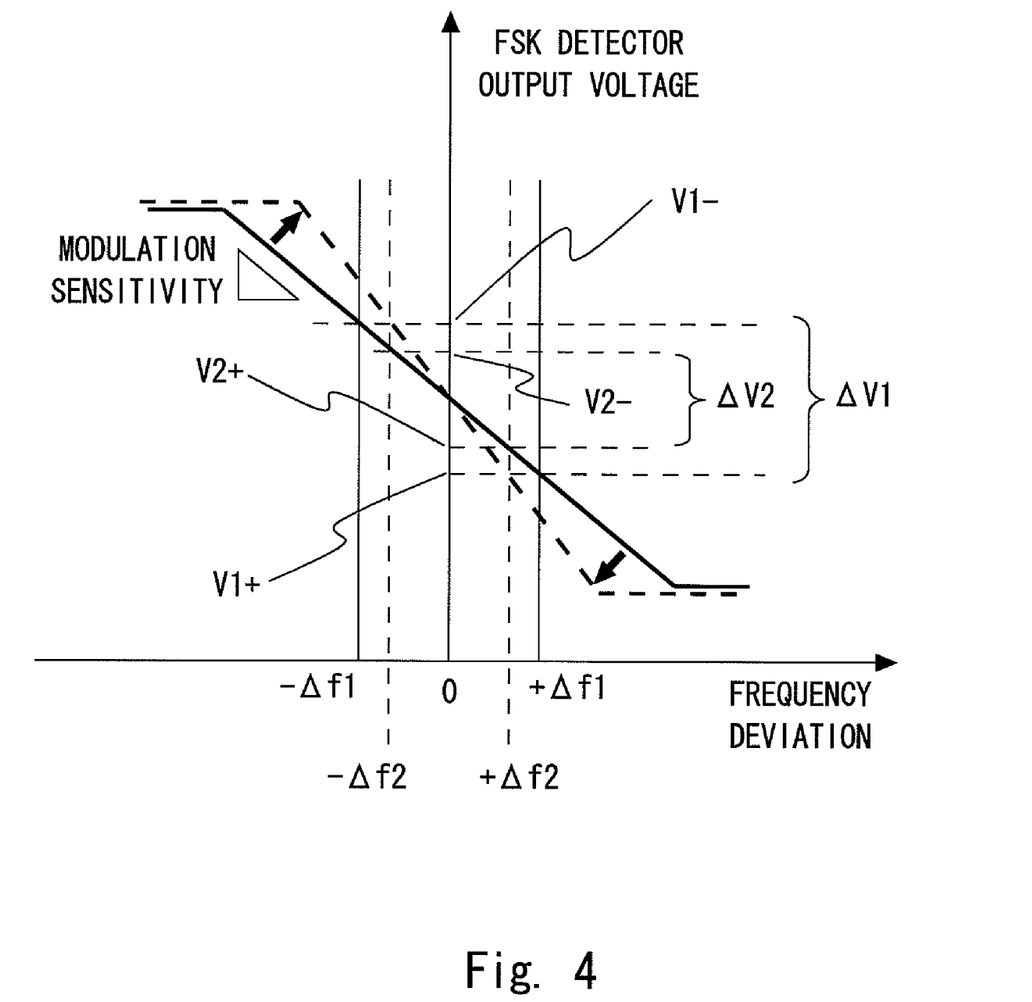
FIG. 4 shows modulation sensitivity characteristics of an FSK detector.

Now, in the specification of the frequency deviation Δf2 (Δf2<Δf1, as an example), it is possible to make the bandwidth of the complex band-pass filter 3 narrower by the amount corresponding to a difference between Δf2 and Δf1, as shown in FIG. 3. FIG. 3 shows IF filter characteristics with a horizontal axis showing frequency deviation and a longitudinal axis showing gain. As shown in FIG. 3, when the frequency deviation Δf2 is small, the deviation amount from f=0 is small, and only the detection of the narrow bandwidth is enough. Similarly, as shown in FIG. 4, it is possible to make the FSK detectable range narrower by the amount corresponding to the difference between Δf2 and Δf1. FIG. 4 shows modulation sensitivity characteristics of the FSK detector. As shown in FIG. 4, the inclination when the horizontal axis indicates frequency deviation and the longitudinal axis indicates FSK detector output voltage is the modulation sensitivity. In a case of Δf1, the output voltage difference between −Δf1 and Δf1 becomes ΔV1 (solid line). On the other hand, when the frequency deviation becomes Δf2, the output voltage difference between −Δf2 and Δf2 becomes ΔV2 (ΔV2<ΔV1). Thus, in order to obtain the output voltage difference ΔV1 even with the range of between −Δf2 and Δf2, the modulation sensitivity needs to be made higher (dashed line). It is possible to set the output voltage difference between −Δf2 and Δf2 to ΔV1 by increasing the modulation sensitivity.

From the above description, the system bandwidth noise is suppressed by increasing the external resistance value Rext and making the bandwidth of the complex band-pass filter 3 narrower, from the expressions (3) and (4). Further, by increasing the modulation sensitivity of the FSK detector, it is possible to increase the difference voltage ΔV input to the comparator 6 compared with a case of the modulation sensitivity (ΔV2) of the frequency deviation Δf1, which makes it possible to increase S/N and to obtain the higher reception sensitivity.

Further, when the transmitter has the frequency stability as low as a SAW resonator as well (±several hundreds of ppm), the external resistance value Rext for current adjustment is adjusted in accordance with the stability so that the complex band-pass filter 3 is controlled to have the minimum bandwidth. Further, along with control, the modulation sensitivity of the FSK detector 5 is increased, which makes it possible to obtain the higher reception sensitivity.

In the exemplary embodiment, the external resistance value Rext for current adjustment is adjusted in accordance with various specifications required in the FSK receiver (frequency deviation, frequency stability of transmitter), so that the IF band-pass filter bandwidth and the modulation sensitivity of the FSK detector can be optimized while being made correspondent to each other. As such, it is possible to provide a receiver which can realize the high-sensitive receiving.

In summary, by adjusting the external resistance value Rext for current adjustment for the systems of the frequency deviations of different specifications, the FSK receiver which can perform receiving operation with high sensitivity can be realized. Further, by adjusting the external resistance value Rext for current adjustment for configurations in which the frequency stability of the transmitter is different, it is possible to realize the FSK receiver which can perform receiving operation with high sensitivity. Further, as the block configuration is simple and the chip layout area can be made smaller, this configuration can be preferably employed in IC.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A receiver, comprising:
   a passband limiter that limits a passband of an IF (Intermediate Frequency) signal;
   a detector that detects the IF signal passing through the passband limiter to generate a detection signal; and
   a controller that controls a modulation sensitivity of the detector and a pass bandwidth of the passband limiter, wherein
   the controller controls the modulation sensitivity according to the pass bandwidth, and the controller generates a first current and a second current according to a resistance value of an external resistor for current adjustment, controls the modulation sensitivity of the detector by the first current, and controls the pass bandwidth by the second current.

2. The receiver according to claim 1, wherein the controller controls the modulation sensitivity so that the modulation sensitivity increases as the pass bandwidth decreases.

3. The receiver according to claim 1, wherein the passband limiter is formed of a complex band-pass filter.

4. The receiver according to claim 2, wherein the passband limiter is formed of a complex band-pass filter.

5. The receiver according to claim 1, wherein the detector is a PLL (Phase Locked Loop)-type FSK detector including a phase comparator, a low-pass filter, and an amplifier.

6. The receiver according to claim 2, wherein the detector is a PLL (Phase Locked Loop)-type FSK detector including a phase comparator, a low-pass filter, and an amplifier.

7. The receiver according to claim 1, wherein
   the passband limiter is formed of a complex band-pass filter including a low-pass filter,
   the detector is a PLL-type FSK detector including a phase comparator, a low-pass filter, and an amplifier, and
   the first current controls an output voltage of the amplifier, and the second current controls a cutoff frequency of the low-pass filter of the complex band-pass filter.

8. A receiving method, comprising:
   limiting a passband of an IF (Intermediate Frequency) signal by a passband limiter;
   detecting the IF signal passing through the passband limiter by a detector having a modulation sensitivity according to a pass bandwidth of the passband limiter to generate a detection signal;
   generating a first current and a second current according to a resistance value of an external resistor for current adjustment; and
   controlling the modulation sensitivity of the detector by the first current, and controlling the pass bandwidth by the second current.

9. The receiving method according to claim 8, wherein a controller controls the modulation sensitivity so that the modulation sensitivity increases as the pass bandwidth decreases.

10. The receiving method according to claim 8, wherein
    the passband limiter is formed of a complex band-pass filter including a low-pass filter,
    the detector is a PLL-type FSK detector including a phase comparator, a low-pass filter, and an amplifier, and
    the first current controls an output voltage of the amplifier, and the second current controls a cutoff frequency of the low-pass filter of the complex band-pass filter.

* * * * *